US012588282B2

(12) United States Patent
Jain et al.

(10) Patent No.: US 12,588,282 B2
(45) Date of Patent: Mar. 24, 2026

(54) INTEGRATED STRUCTURE WITH TRAP RICH REGIONS AND LOW RESISTIVITY REGIONS

(71) Applicant: GlobalFoundries U.S. Inc., Malta, NY (US)

(72) Inventors: Vibhor Jain, Williston, VT (US); Crystal R. Kenney, Waterford, NY (US); John J. Pekarik, Underhill, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 661 days.

(21) Appl. No.: 17/985,861

(22) Filed: Nov. 13, 2022

(65) Prior Publication Data

US 2024/0162232 A1      May 16, 2024

(51) Int. Cl.
| | |
|---|---|
| *H10D 86/00* | (2025.01) |
| *H01L 21/762* | (2006.01) |
| *H01L 23/66* | (2006.01) |
| *H10D 86/01* | (2025.01) |

(52) U.S. Cl.
CPC ..... *H10D 86/201* (2025.01); *H01L 21/76267* (2013.01); *H01L 21/76283* (2013.01); *H01L 23/66* (2013.01); *H10D 86/01* (2025.01); *H01L 2223/6672* (2013.01)

(58) Field of Classification Search
CPC ............ H01L 21/761; H01L 21/76267; H10D 30/6704; H10D 84/401; H10D 84/403; H10D 86/201
See application file for complete search history.

(56) References Cited

U.S. PATENT DOCUMENTS

| | | | |
|---|---|---|---|
| 6,743,662 B2 | 6/2004 | Fathimulla et al. | |
| 9,754,814 B2 | 9/2017 | Hurwitz | |
| 9,912,323 B1 * | 3/2018 | Ardalan ................. | H03K 5/135 |
| 10,192,779 B1 | 1/2019 | Shank et al. | |
| 10,923,503 B2 | 2/2021 | Cheng et al. | |
| 11,271,077 B2 | 3/2022 | Stamper et al. | |
| 11,271,079 B2 | 3/2022 | Stamper et al. | |
| 2003/0223258 A1 | 12/2003 | Wei et al. | |

(Continued)

FOREIGN PATENT DOCUMENTS

| | | |
|---|---|---|
| WO | 2020/097003 | 5/2020 |
| WO | 2020097003 A1 | 5/2020 |

OTHER PUBLICATIONS

Biyao Zhao et al., "Localized Backside Etching Structure of SOI Substrates on Total Ionizing Dose Effect Hardening for RF Applications", IEEE Transactions on Electron Devices, vol. 69, No. 5, May 2022, 6 pages.

(Continued)

*Primary Examiner* — Nelson Garces
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a substrate with trap rich and low resistivity regions and methods of manufacture. The structure includes: a high resistivity semiconductor substrate; an active device over the high resistivity semiconductor substrate; and a low resistivity region floating in the high resistivity semiconductor substrate and which is below the active device.

15 Claims, 2 Drawing Sheets

(56) References Cited

U.S. PATENT DOCUMENTS

| | | | |
|---|---|---|---|
| 2010/0200927 A1 | 8/2010 | Greco et al. | |
| 2016/0372484 A1* | 12/2016 | Nguyen | H01L 21/266 |
| 2018/0069079 A1* | 3/2018 | Fanelli | H10D 84/038 |
| 2019/0057868 A1 | 2/2019 | Englekirk et al. | |
| 2020/0035785 A1 | 1/2020 | Singh et al. | |
| 2021/0280672 A1 | 9/2021 | Stamper et al. | |
| 2022/0122968 A1* | 4/2022 | Jain | H10D 84/645 |
| 2022/0123107 A1 | 4/2022 | Jain et al. | |
| 2022/0123118 A1 | 4/2022 | Yang | |

OTHER PUBLICATIONS

Ben Ali et al., "RF SOI CMOS technology on commercial trap-rich high resistivity SOI wafer", SOI wafer.2012 IEEE International SOI Conference. In: Proceedings of the SOI Conference (SOI), 2012 IEEE International, 2012, p. 2 http://hdl.handle.net/2078/121766, 3 pages.
Extended European Search Report and Opinion dated Mar. 18, 2024 in EP Application No. 23197843.8-1211, 7 pages.
Extended European Search Report and Opinion dated Aug. 22, 2025 in EP Application No. 24197793.3-1211 / 4447124, 9 pages.

* cited by examiner

INTEGRATED STRUCTURE WITH TRAP RICH REGIONS AND LOW RESISTIVITY REGIONS

This invention was made with government support under Contract #HR0011-20-3-0002 awarded by Darpa (under T-Music). The government has certain rights in the invention.

BACKGROUND

The present disclosure relates to semiconductor structures and, more particularly, to an integrated structure with trap rich regions (high resistivity regions) and low resistivity regions and methods of manufacture.

BiCMOS integration on high resistivity semiconductor substrates requires different parameters for different devices. These different parameters may not be compatible amongst all of the integrated devices, e.g., circuitry, residing on the same substrate. In the manufacturing process, these different parameters may also result in low yields for other devices.

SUMMARY

In an aspect of the disclosure, a structure comprises: a high resistivity semiconductor substrate; an active device over the high resistivity semiconductor substrate; and a low resistivity region floating in the high resistivity semiconductor substrate and which is below the active device.

In an aspect of the disclosure, a structure comprises: a handle substrate comprising high resistivity semiconductor material; a buried insulator layer above the handle substrate; a semiconductor layer on the buried insulator layer; an active device over the semiconductor layer; a non-single-crystal semiconductor region in the handle substrate underneath the active device and contacting an underside of the buried insulator layer; and a low resistivity region floating in the handle substrate and which is below the active device.

In an aspect of the disclosure, a method comprises: forming an active device over a high resistivity semiconductor substrate; and forming a low resistivity region floating in the high resistivity semiconductor substrate and which is below the active device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a structure with a trap rich region (high resistivity region) and a low resistivity region and methods of manufacture. More specifically, the present disclosure is directed to a BiCMOS integrated structure on a high resistivity wafer with trap rich implant regions and low resistivity implant regions. Advantageously, the integration scheme maintains high NPN yield with reduced device to device leakage for BiCMOS integration, in addition to maintaining back end of the line (BEOL) passive device and RF FET performance (e.g., switches). The present disclosure also provides the benefit of radiation hardening of FET devices.

In embodiments, the structure may include an integrated circuit for radiation hardened electronics. The structure includes a high resistivity semiconductor material comprising semiconductor-on-insulator (SOI) technology. The structure includes a region with a high resistivity implant touching a buried insulator material, forming a trap rich layer below RF FETs or BEOL passive devices. A hybrid region may be surrounded by a deep trench isolation structure and includes a low resistivity region below a bipolar device, FET, or diode, etc. Another region includes both a trap rich region and low resistivity region below a logic FET or other active device. Another region with a FET or passive device is completely devoid of both the trap rich region and low resistivity region.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
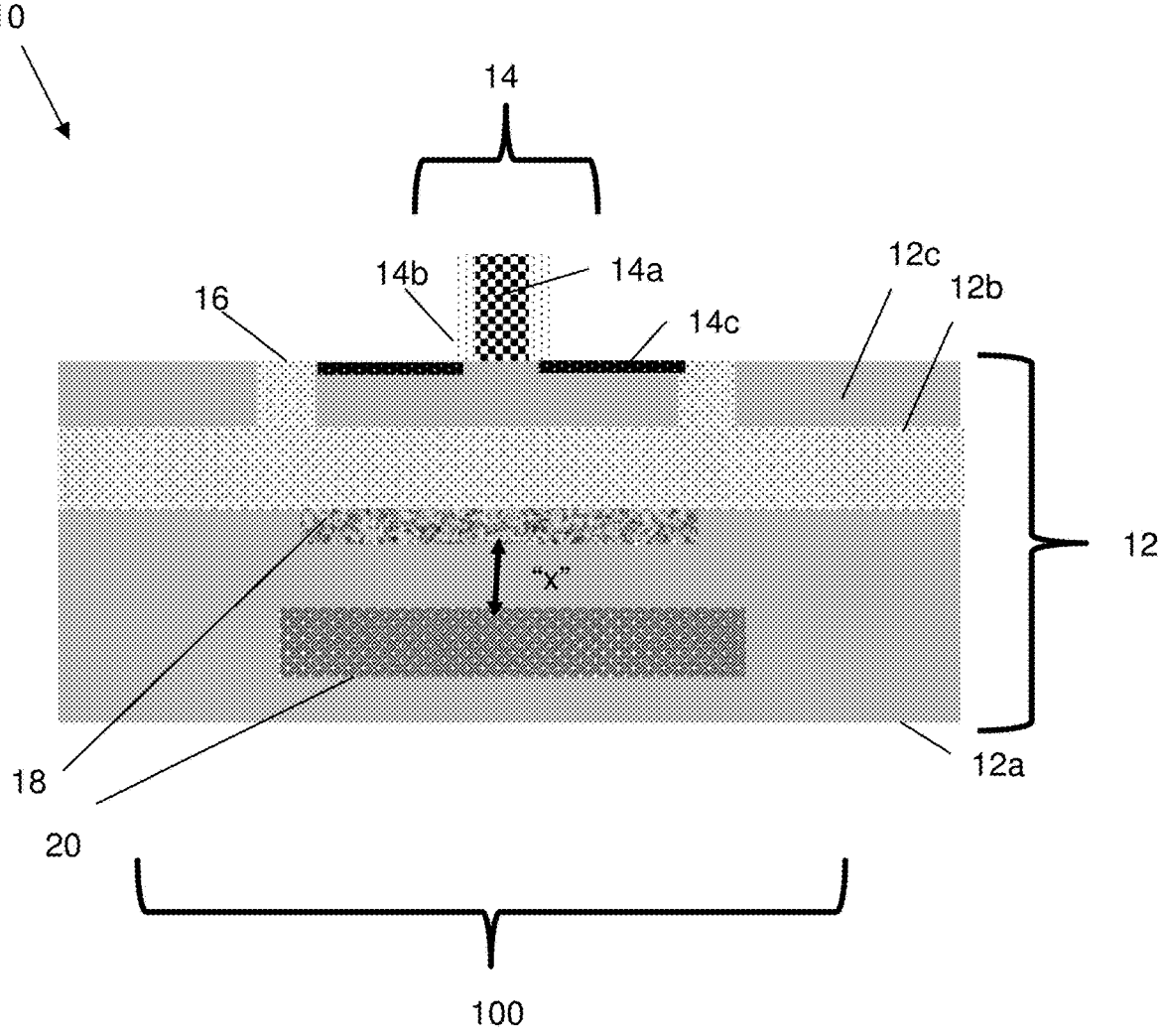
FIG. 1 shows a structure with both a high resistivity region and a low resistivity region under an active device, amongst other features, and respective fabrication processes in accordance with the present disclosure.

FIG. 1 shows a structure with both a high resistivity region and a low resistivity region under an active device, amongst other features, and respective fabrication processes in accordance with the present disclosure. In particular, the structure 10 includes a device region 100 comprising an active device 14 between shallow trench isolation structures 16. In more specific embodiments, the active device 14 may be a logic device (e.g., FET) for radiation hardened applications. The active device 14 may be provided on a semiconductor substrate 12 as described in more detail herein.

In embodiments, the active device 14 includes a gate electrode 14a surrounded by sidewall spacers 14b. The gate electrode 14a may be any known workfunction metal, e.g., Ti, TiN, TiAl, etc., or a polysilicon material. The sidewall spacers 14b may be an oxide and/or nitride material fabricated using conventional deposition methods, e.g., chemical vapor deposition (CVD), followed by a conventional anisotropic etching process as is known in the art. The active device 14 also includes source and drain regions 14c which are provided in the semiconductor substrate 12 (and more specifically, on a semiconductor-on-insulator substrate). The gate electrode 14a may be provided on a gate dielectric material, e.g., a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The device 14 can be fabricated using conventional CMOS processes. For example, in standard CMOS processing, a gate dielectric material and gate electrode material are formed, e.g., deposited, onto the semiconductor substrate 12, followed by a conventional patterning process. An insulator material such as nitride and/or oxide can be deposited on the patterned materials, followed by an anisotropic etching process to form the sidewall spacers 14*b*. The source and drain regions 14*c* may be formed by a conventional ion implantation process or an epitaxial growth process with an in-situ doping as is known in the art. It is well understood by those of skill in the art that the source and drain regions 14*c* could also be formed by using both epitaxial growth and implantation processes such that the top of the source and drain regions 14*c* is above the top of the semiconductor substrate 12, i.e., top semiconductor layer 12*c*.

Although not critical to the understanding of the present disclosure, a silicide contact may be formed on the source and drain regions 14*c* and gate electrode (e.g., polysilicon material). As should be understood by those of skill in the art, the silicide process begins with deposition of a thin transition metal layer, e.g., nickel, cobalt or titanium, over fully formed and patterned semiconductor devices (e.g., doped or ion implanted source and drain regions 14*c* and respective device (if polysilicon material). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices when a gate structure is composed of a metal material.

Still referring to FIG. 1, the semiconductor substrate 12 may comprise semiconductor-on-insulator (SOI) technology. The semiconductor substrate 12 includes, from bottom to top, a handle substrate 12*a*, a buried insulator layer 12*b*, and a top semiconductor layer 12*c*. The handle substrate 12*a* may be a high resistivity substrate to provide increased radio frequency (RF) performance. In embodiments, the handle substrate 12*a* may be a P-semiconductor substrate with a resistivity in the range of about between 1 Kohm-cm to greater than 10 Kohm-cm, as an illustrative example. The handle substrate 12*a* provides mechanical support to the buried insulator layer 12*b* and the top semiconductor layer 12*c*.

The buried insulator layer 12*b* may include a dielectric material such as silicon dioxide, silicon nitride, silicon oxynitride, boron nitride or a combination thereof. In one preferred embodiment, the buried insulator layer 12*b* may be a buried oxide (BOX). The buried insulator layer 12*b* may be formed by a deposition process, such as chemical vapor deposition (CVD), plasma enhanced chemical vapor deposition CVD (PECVD) or physical vapor deposition (PVD). In another embodiment, the buried insulator layer 12*b* may be formed using a thermal growth process, e.g., thermal oxidation, or an implanting process where oxygen atoms are implanted and annealed into the handle substrate 12*a*.

The handle substrate 12*a* and top semiconductor layer 12*c* may include any appropriate semiconductor material, e.g., Si, Ge, SiGe, SiC, SiGeC, a III-V compound semiconductor, an II-VI compound semiconductor or any combinations thereof. Typically, the handle substrate 12*a* and the top semiconductor layer 12*c* comprise a single crystalline semiconductor material, such as, for example, single crystalline silicon with any suitable crystallographic orientation (e.g., a (100), (110), (111), or (001) crystallographic orientation).

Still referring to FIG. 1, an optional non-single-crystal semiconductor region 18 may be formed in the handle substrate 12*a*. In more specific embodiments, the non-single-crystal semiconductor region 18 may be trap rich region and, more specifically, an amorphous region or polysilicon region. In embodiments, the non-single-crystal semiconductor region 18 may be formed directly underneath and in contact with an underside of the buried insulator layer 12*b*, underneath the device 14.

In embodiments, the non-single-crystal semiconductor region 18 may reduce the effects of a total ionizing dose (TID). For example, the non-single-crystal semiconductor region 18 can create traps so that the charge carriers formed as a result of ionizing radiation can recombine so that a Vt (or performance) of the device 14 does not change. It should be understood by those of ordinary skill in the art that the effects of total ionizing dose in electronics can include a parametric degradation that leads to device degradation and functional failure. This includes threshold voltage shifts which can alter the way electronics function, such as how they are activated or deactivated. Reduced gain, increased leakage, timing changes and decreased functionality can also occur.

The non-single-crystal semiconductor region 18 may be formed by an implantation process, using a patterned implantation mask. For example, the non-single-crystal semiconductor region 18 may be formed by a blanket argon implant process; although the use of any non-dopant or noble gas is contemplated herein for the implantation process.

As an illustrative, non-limiting example, the handle substrate 12*a* can be subjected to an argon implant at 300 KeV and a dose of $1\times10^{15}$ cm$^{-2}$. By way of further illustrative examples, other implant parameters are contemplated herein depending on the desired thickness and depth of the implant region including, e.g., the ion dose may be less than or greater than $1\times10^{15}$ cm$^{-2}$ or within a range of $1\times10^{13}$ cm$^{-2}$ to $5\times10^{16}$ cm$^{-2}$. Similarly the energy of the implant can be adjusted depending on the desired depth from surface of the trap rich region. The thickness of the non-single-crystal semiconductor region 18 can be adjusted depending on the parameters of the implantation process. In this way, the non-single-crystal semiconductor region 18 may be a high resistivity region, e.g., higher than the resistivity of the handle substrate 12*a*, which will reduce the TID.

FIG. 1 further shows a low resistivity region 20 in the handle substrate 12*a*. In embodiments, the low resistivity region 20 may be used to reduce single event upsets. As should be understood by those of skill in the art, the single-event upset (SEU) is a change of state caused by one single ionizing particle (ions, electrons, photons, etc.) striking a sensitive node in a micro-electronic device, e.g., device 14. The state change is a result of the free charge (electron hole pair (EHP)) created by ionization in or close to an important node of a logic element. The error in device output or operation caused as a result of the strike is called an SEU or a soft error.

The low resistivity region 20 may be an implanted region comprising boron, which has a lower resistivity than the handle substrate 12*a*. For example, the lower resistivity region 20 may be less than 100 Ohm-cm to 0.001 Ohm-cm depending on the implant conditions. In embodiments, the low resistivity region 20 is a floating region (e.g., no electrical connections) that is separated from and makes no contact with the non-single-crystal semiconductor region 18 or the device 14. In embodiments, the low resistivity region 20 may be separated from the non-single-crystal semiconductor region 18 by a high resistivity region of the handle substrate 12*a* by a distance "X", where "X" is about 0.5 microns; although other distances are also contemplated herein depending on the desired device performance, as well as the thickness of the handle substrate 12*a*.

The low resistivity region 20 may be formed by an implantation process using a patterned implantation mask. For example, the low resistivity region 20 may be formed by a blanket boron implant process. As an illustrative, non-limiting example, the handle substrate 12*a* can be subjected to a boron implant at 400 keV and a dose of 5E11 cm 2. By way of further illustrative examples, other implant parameters are contemplated herein depending on the desired thickness and depth of the implant region including, e.g., the ion dose may be less than or greater than 5E11 cm$^{-2}$ or within a range of 5E10 to 1E17 cm$^{-2}$. The energy of the implant can be adjust depending on the desired depth of the low resistivity region 20. The thickness of the low resistivity region 20 can be adjusted depending on the parameters of the implantation process.

For both the low resistivity region 20 and the non-single-crystal semiconductor region 18, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Figure 2:
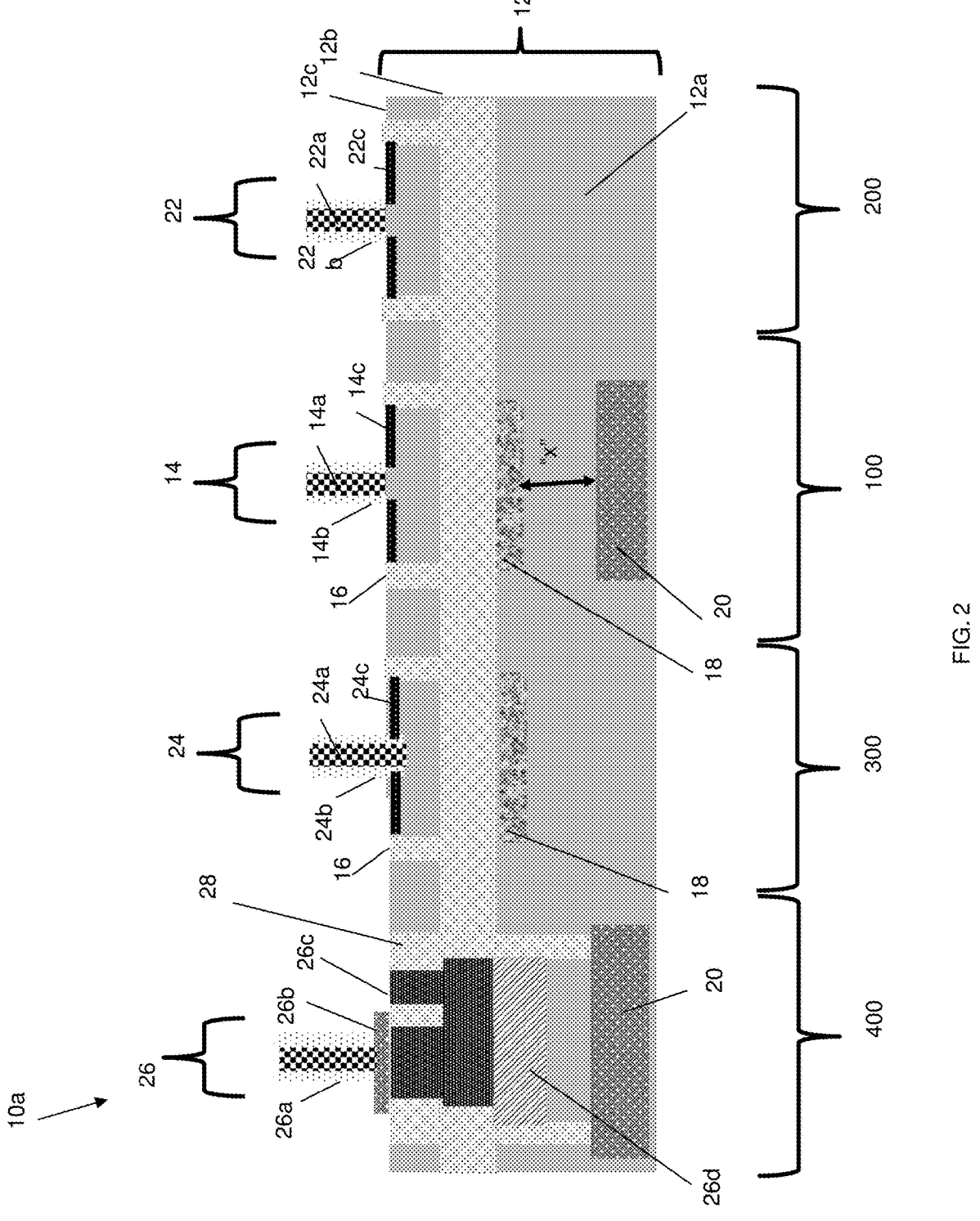
FIG. 2 shows an integrated design layout and respective fabrication processes in accordance with the present disclosure.

FIG. 2 shows an integrated design layout in accordance with aspects of the present disclosure. In particular, the integrated design layout 10*a* includes four device regions: device region 100, device region 200, device region 300, and device region 400. As shown in FIG. 2, each of the device regions 100, 200, 300, 400 are provided on the semiconductor substrate 12 comprising the handle substrate 12*a*, the buried insulator layer 12*b* and the top semiconductor layer 12*c* as described with respect to FIG. 1. It should also be recognized that device region 100 is the device region 100 described with respect to FIG. 1.

The device region 200 may include a standard logic device 22. Alternatively, the device region 200 may include a passive device. In the implementation of the standard logic device 22, the logic device 22 includes a gate electrode 22*a* surrounded by sidewall spacers 22*b*. The gate electrode 20*a* may be any known workfunction metal, e.g., Ti, TiN, TiAl, etc., or a polysilicon material. The sidewall spacers 22*c* may be an oxide and/or nitride material fabricated using conventional deposition methods, e.g., CVD, followed by a conventional anisotropic etching process as is known in the art. The active device 22 also includes source and drain regions 22*c* which are provided in the semiconductor layer 12*c*. This also may be a raised source and drain regions 22*c* formed by epitaxial growth and implantation processes as already described herein. The gate electrode 22*a* may be provided on a gate dielectric material, e.g., a high-k gate dielectric material, e.g., HfO$_2$ Al$_2$O$_3$, Ta$_2$O$_3$, TiO$_2$, La$_2$O$_3$, SrTiO$_3$, LaAlO$_3$, ZrO$_2$, Y$_2$O$_3$, Gd$_2$O$_3$, and combinations including multilayers thereof. The device region 200 is devoid of any high resistivity region and low resistivity region.

The device region 300 includes a standard RF device or BEOL passive device 24. In this implementation, the standard RF device 24 includes a gate electrode 24*a* surrounded by sidewall spacers 24*b*, in addition to source and drain regions 24*c*. The device region 300 also includes the nonsingle-crystal semiconductor region 18 formed directly underneath and in contact with an underside of the buried insulator layer 12*b*, underneath the device 24. The non-single-crystal semiconductor region 18 in device regions 100 and 300 may be formed in the same implantation process with the same patterned mask. As previously disclosed, the low resistivity region 20 may be an implanted region comprising argon. The device region 300, though, is devoid of any low resistivity region.

The device region 400 includes a heterojunction bipolar transistor 26, e.g., NPN. In embodiments, the device region 400 may include other devices such as a diode or passive device. As is known in the art, the heterojunction bipolar transistor 26 includes an emitter 26*a*, an extrinsic/intrinsic base region 26*b*, a collector region 26*c* and a sub-collector region 26*d*. In embodiments, the collector region 26*c* is formed over the sub-collector region 26*d*. The collector region 26*c* may be Si material, as an example. The sub-collector region 26*d* may be formed in the handle substrate 12*a* by an ion implant process, using a patterned mask as is known in the art. The implant can be a n-type dopant, e.g., Arsenic (As), Phosphorus (P) and Sb, among other suitable examples. The extrinsic/intrinsic base region 26*b* may be a semiconductor material, e.g., SiGe, epitaxially grown on the top semiconductor layer 12*c*. The emitter 26*a* may be an N-type semiconductor material epitaxially grown on the intrinsic base region 26*b*.

The collector region 26*c* and sub-collector region 26*d* are isolated within deep trench isolation structures 28. In embodiments, the deep trench isolation structures 28 can be formed by conventional lithography, etching and deposition methods known to those of skill in the art. For example, a resist formed over the top semiconductor layer 12*c* is exposed to energy (light) and developed utilizing a conventional resist developer to form a pattern (opening). An etching process with a selective chemistry, e.g., reactive ion etching (RIE), will be used to transfer the pattern from the patterned photoresist layer to the top semiconductor layer 12*c* and handle substrate 12*a* to form one or more trenches. Following the resist removal by a conventional oxygen ashing process or other known stripants, insulator material can be deposited by any conventional deposition processes, e.g., CVD processes. Any residual material on the surface of the top semiconductor layer 12*c* can be removed by conventional chemical mechanical polishing (CMP) processes.

Still referring to device region 400, the low resistivity region 20 is formed in the handle substrate 12*a* under the sub-collector region 26*d*. In further embodiments, the low resistivity region 20 does not contact the sub-collector region 26*d*. The low resistivity region 20 may contact the deep trench isolation regions 28 in order to isolate the device 26. The low resistivity region 20 in device regions 100 and 400 may be formed in the same implantation process with the same mask. As previously disclosed, the low resistivity region 20 may be an implanted region comprising boron, which has a lower resistivity than the handle substrate 12*a*.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a high resistivity semiconductor substrate;
an active device over the high resistivity semiconductor substrate; and
a low resistivity region floating in the high resistivity semiconductor substrate and which is below the active device, wherein
the high resistivity semiconductor substrate comprises a high resistivity handle substrate underneath a buried insulator layer and a top semiconductor layer, wherein the low resistivity region comprises boron, and
the low resistivity region is floating below and not touching the buried insulator layer and the active device in the high resistivity handle substrate, with a high resistivity region between the active device and the low resistivity region.

2. The structure of claim 1, further comprising a non-single-crystal semiconductor region in the high resistivity handle substrate.

3. The structure of claim 2, wherein the non-single-crystal semiconductor region comprises one of amorphous and polycrystalline semiconductor material in contact with an underside of the buried insulator layer and separated from the low resistivity region.

4. The structure of claim 2, wherein the non-single-crystal semiconductor region comprises a trap rich semiconductor region in contact with an underside of the buried insulator layer and separated from the low resistivity region.

5. The structure of claim 2, wherein the active device comprises a logic transistor.

6. The structure of claim 2, further comprising a device over the high resistivity handle substrate and which is devoid of the low resistivity region and the non-single-crystal semiconductor region.

7. The structure of claim 2, further comprising a device over the high resistivity handle substrate and which is devoid of the low resistivity region and includes the non-single-crystal semiconductor region under the device.

8. The structure of claim 2, further comprising a device over the high resistivity handle substrate and which is devoid of the non-single-crystal semiconductor region and includes the low resistivity region under the device.

9. A structure comprising:
a handle substrate comprising high resistivity semiconductor material;
a buried insulator layer above the handle substrate;
a semiconductor layer on the buried insulator layer;
an active device over the semiconductor layer;
a non-single-crystal semiconductor region in the handle substrate underneath the active device and contacting an underside of the buried insulator layer; and
a low resistivity region comprises boron floating in the handle substrate and which is below the active device.

10. The structure of claim 9, wherein the non-single-crystal semiconductor region comprises one of amorphous and polycrystalline semiconductor material.

11. The structure of claim 9, wherein the non-single-crystal semiconductor region comprises trap rich semiconductor material in contact with an underside of the buried insulator layer and separated from the low resistivity region.

12. The structure of claim 9, further comprising a second device over the semiconductor layer, wherein the high resistivity semiconductor material under the second device is devoid of the low resistivity region and the non-single-crystal semiconductor region.

13. The structure of claim 12, further comprising a third device over the semiconductor layer, wherein the high resistivity semiconductor material under the third device is devoid of the low resistivity region and includes the non-single-crystal semiconductor region.

14. A structure comprising:
a handle substrate comprising high resistivity semiconductor material;
a buried insulator layer above the handle substrate;
a semiconductor layer on the buried insulator layer;
an active device over the semiconductor layer;
a non-single-crystal semiconductor region in the handle substrate underneath the active device and contacting an underside of the buried insulator layer;
a low resistivity region floating in the handle substrate and which is below the active device;
a second device over the semiconductor layer, wherein the high resistivity semiconductor material under the second device is devoid of the low resistivity region and the non-single-crystal semiconductor region;
a third device over the semiconductor layer, wherein the high resistivity semiconductor material under the third device is devoid of the low resistivity region and includes the non-single-crystal semiconductor region; and
a fourth device over the handle substrate, wherein the high resistivity semiconductor material under the fourth device is devoid of the non-single-crystal semiconductor region and includes the low resistivity region.

15. The structure of claim 9, wherein the active device comprises a radiation hardened logic device.

* * * * *